United States Patent [19]

Khang et al.

[11] Patent Number: 5,889,724
[45] Date of Patent: Mar. 30, 1999

[54] WORD LINE DRIVING CIRCUIT FOR SEMICONDUCTOR MEMORY DEVICE AND METHOD

[75] Inventors: Chang-Man Khang, Kyeonggi-do; Chang-Jin Lee, Seoul, both of Rep. of Korea

[73] Assignee: LG Semicon Co., Ltd., Cheongju-si, Rep. of Korea

[21] Appl. No.: 992,572

[22] Filed: Dec. 17, 1997

[30] Foreign Application Priority Data

Dec. 28, 1996 [KR] Rep. of Korea .................. 1996-75715

[51] Int. Cl.[6] ................................. G11C 8/00; G11C 7/00
[52] U.S. Cl. ............................... 365/230.03; 365/230.06; 365/200; 365/225.7
[58] Field of Search .................... 365/230.03, 230.06, 365/200, 225.7, 189.05, 230.08

[56] References Cited

U.S. PATENT DOCUMENTS

| | | | |
|---|---|---|---|
| 4,951,259 | 8/1990 | Sato et al. | 365/230.06 |
| 5,349,556 | 9/1994 | Lee | 365/200 |
| 5,361,231 | 11/1994 | Hayano | 365/200 |
| 5,394,368 | 2/1995 | Miyamoto | 365/200 |
| 5,469,388 | 11/1995 | Park | 365/200 |
| 5,596,536 | 1/1997 | Koh | 365/200 |

*Primary Examiner*—David Nelms
*Assistant Examiner*—Trong Phan
*Attorney, Agent, or Firm*—Fleshner & Kim

[57] ABSTRACT

A word line driving circuit for a semiconductor memory is provided that drives a corresponding word line of a first number of word lines coupled to a plurality of memory cells based on a memory address signal generated from a more significant controller. The memory cells have a matrix form of rows and columns and the first number of word lines are divided into a second number of word line groups. The word line driving circuit includes a second number of word line group driving circuits each respectively coupled to one of the second number of word line groups to drive one of the word lines in the word line group selected by a control signal. A word line selecting circuit determines which of the second word line groups contain the corresponding word line to be driven using the memory address signal and generates the control signal for the corresponding word line group driving circuit.

13 Claims, 4 Drawing Sheets

WORD LINE DRIVING CIRCUIT FOR SEMICONDUCTOR MEMORY DEVICE AND METHOD

BACKGROUND OF THE INVENTION

1. Field of the Invention

The present invention relates to a semiconductor memory device, and in particular to a word line driving circuit for a semiconductor memory device.

2. Background of the Related Art

As shown in FIG. 1, a word line driving circuit of a related art semiconductor memory shown in U.S. Pat. No. 4,951, 259 to Sato et al. includes a predecoder PDCR that inputs addresses $ax0$, $_{ax0}$, $ax1$, $_{ax1}$ from an X address buffer XADB (not shown) and outputs signals $\phi x0$, $\phi x1$, $\phi x2$ and $\phi x3$. NAND gate circuits NAG0–NAGk input the addresses $ax2$, $_{ax2}$, ..., $axi$, $_{axi}$ from the X address buffer XADB (not shown) and output the signals $_{s0}$, ..., $_{sk}$. Switch transistors Q13–Q16 have gate terminals that receive the signals $\phi x0$, $\phi x1$, $\phi x2$ and $\phi x3$ output from the predecoder PDCR. The word line driving circuit further includes transistors Q23–Q26 that input a signal $\phi ce$ generated from a timing controller TC (not shown) at their gate terminals and X address decoder blocks WD0, WD3, ..., WDm-3, WDm for driving the word lines W0–Wm.

FIG. 2 shows the word line driving circuit of FIG. 1 and its peripheral circuits, which include the timing controller TC, the X address buffer XADB and the X decoder XDCR. A memory cell array and corresponding bit line sense amplifier arrays are also shown in FIG. 2.

To drive the word line connected to the memory cell, the NAND gate circuits receive and NAND-decode the addresses $ax2$, $_{ax2}$, ..., $axi$, $_{axi}$ generated from the X address buffer XADB and the signal $ce$ of logic high level generated from the timing controller TC and output the signals $_{s0}$, ..., $_{sk}$ of logic low levels. In this case; one of the transistors Q13, Q14, Q15, Q16 shown in FIG. 1 is turned on by the one logic high signal of the signals $\phi x0$, $\phi x1$, $\phi x2$ and $\phi x3$ output from the predecoder PDCR. Thus, a transistor Qd1 in an X address decoder block XDCR is turned on to drive the corresponding word line for a predetermined time.

However, the related art word line driving circuit has various disadvantages. When the related art word line driving circuit is applied to a memory cell block having a plurality of word lines, the required word lines have greater loading, which increases the word line driver size. As the word line driver size increases, the size of the address decoding block and the size of precharge transistor increase. Consequentially, as large amount of currents is consumed at each operation, which increases the power consumption and deteriorates the operating speed.

The above references are incorporated by reference herein where appropriate for appropriate teachings of additional or alternative details, features and/or technical background.

SUMMARY OF THE INVENTION

An object of the present invention is to provide a word line driving circuit that substantially obviates one or more of the problems of the related art.

Another object of the present invention is to provide a low power word line driving circuit.

A further object of the present invention is to provide a high speed word line driving circuit.

A further object of the present invention is to provide a word line driving circuit for driving a word line coupled to memory cells by decoding row addresses.

A further object of the present invention is to provide a word line driving circuit that drives a row decoder and word line driving circuit by dividing a word line selecting circuit with a predetermined number of control signals by decoding a signal $PXk$ ($k=0,1,2,3, \ldots ,n$) to drive one of a plurality of word lines, which reduces power consumption by $1/k$ and enables higher speed operations.

To achieve these and other objects and advantages in a whole or in parts, and in accordance with the purpose of the present invention as embodied and broadly described, a word line driving circuit of a semiconductor device for driving a corresponding word line of a first number of word lines coupled to a plurality of memory cells having a matrix form of rows and columns by a memory address signal generated from a more significant controller, includes a second number of word line group driving circuits each respectively coupled to a second number of word line groups divided from the first number of word lines to activate any one of the word lines in the word line group selected by a control signal; and a word line selecting circuit that determines which of the second number of word line groups contains the corresponding word line to be driven and selects a corresponding word line group driving circuit coupled thereto.

Further aspects of the present invention may be achieved in a whole or in parts by a word line driving circuit for use with a semiconductor memory having a first number of word lines coupled to a plurality of memory cells having a matrix form of rows and columns and a controller that generates a memory address signal, the word line driving circuit includes a row address predecoder for inputting addresses from a row address buffer that stores the memory address signal to generate control signals; a bit line selecting circuit that receives an address from the row address buffer and generates a signal for selecting a bit line corresponding to the address; a second number of row decoder and word line driving circuits respectively coupled to a second number of word line groups divided from the first number of word lines, each receiving some of the control signals generated from the row address predecoder according to a driving control signal to drive the second number of word line groups by a corresponding control signal; and a word line selecting circuit for inputting the signals output from the bit line selecting circuit and the row address predecoder to determine the word line group corresponding to the memory address signal and select one of the second number of row decoder and word line driving circuits coupled thereto and applying the driving control signal to the selected row decoder and word line driving circuit.

Additional advantages, objects, and features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

The invention will be described in detail with reference to the following drawings in which like reference numerals refer to Like elements wherein.

DETAILED DESCRIPTION OF PREFERRED EMBODIMENTS

Figure 1:
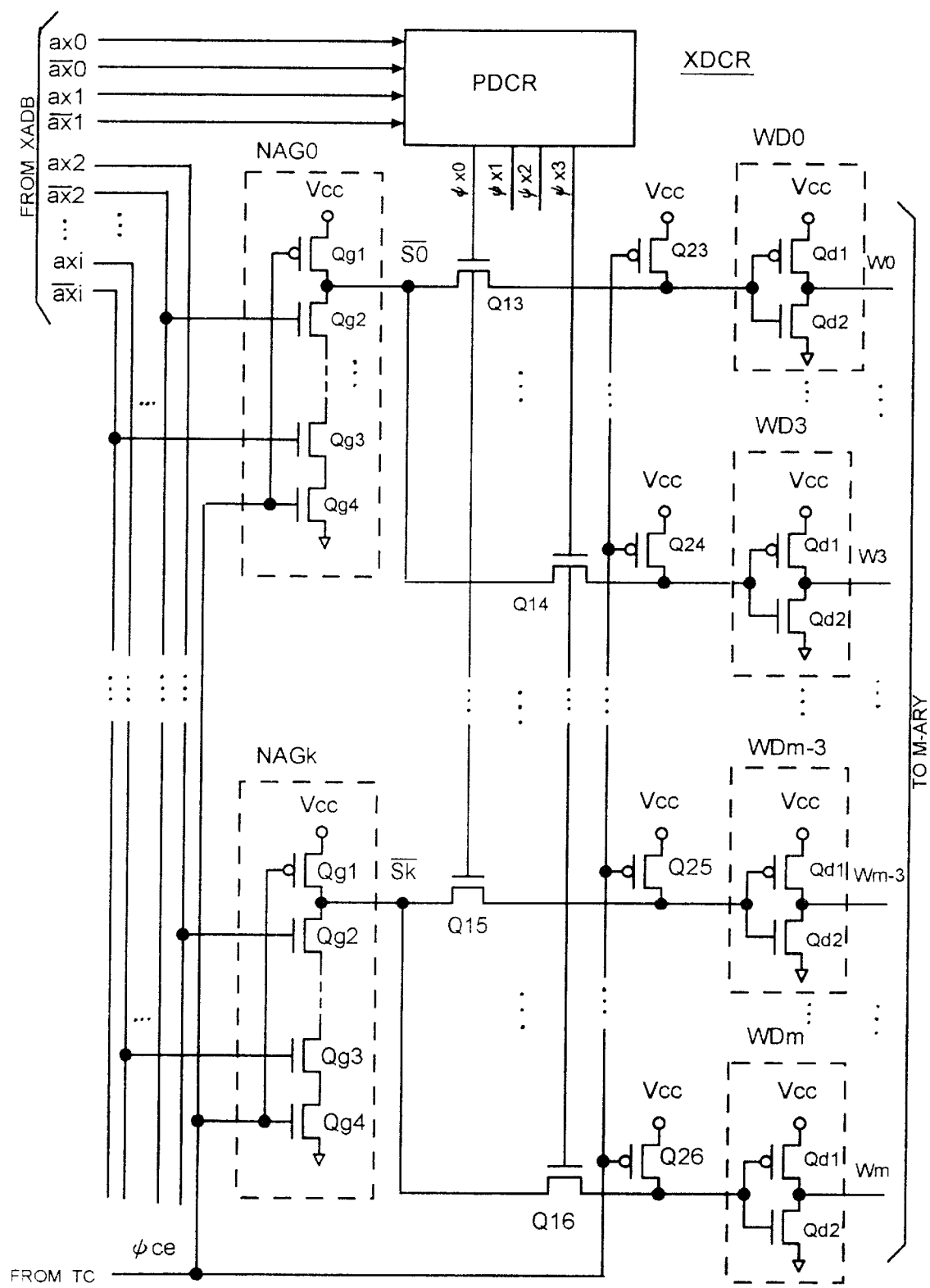
FIG. 1 is a circuit diagram showing a related art word line driving circuit of a semiconductor memory.
Figure 2:
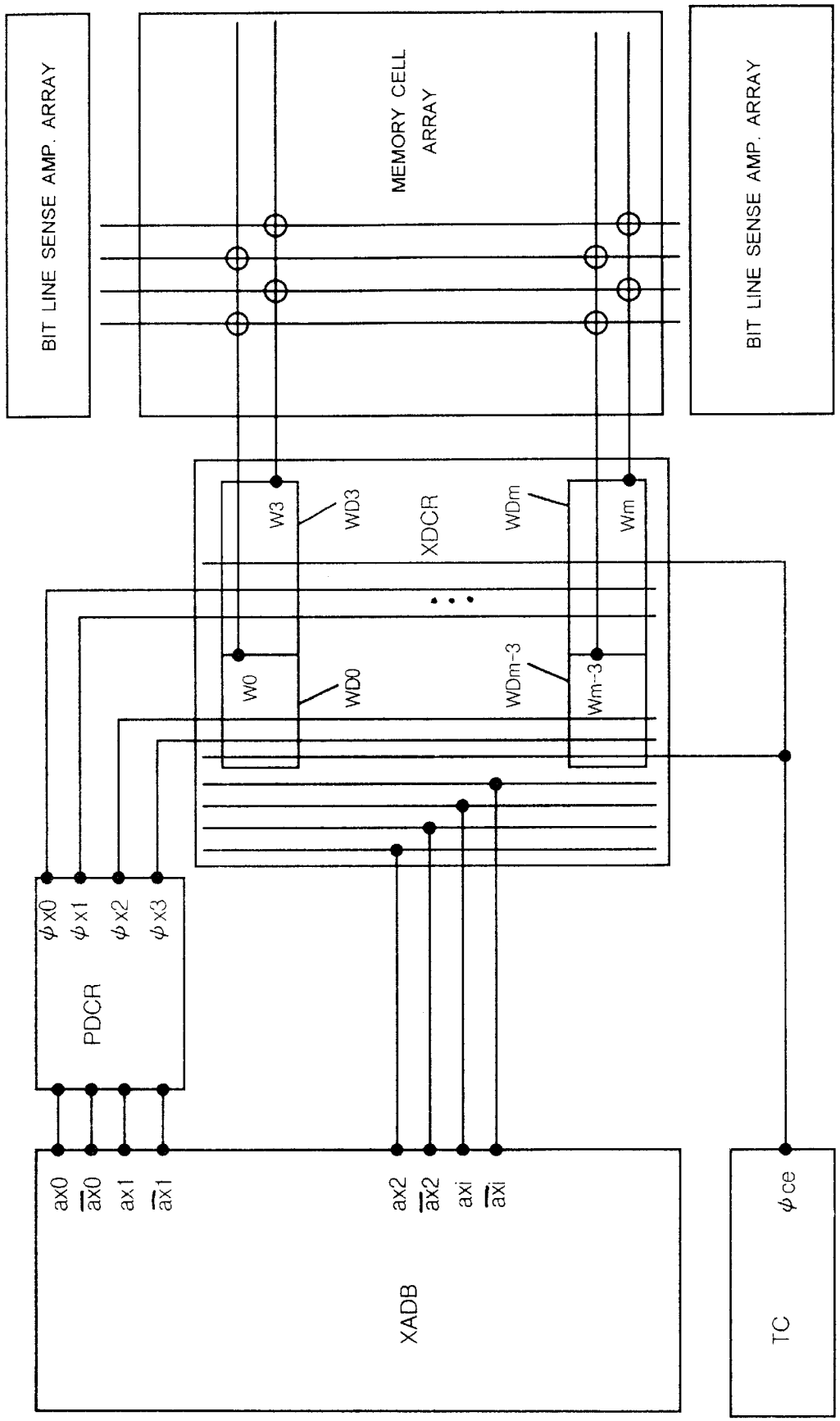
FIG. 2 is a block diagram showing the word line driving circuit of FIG. 1 with peripheral circuits.
Figure 3:
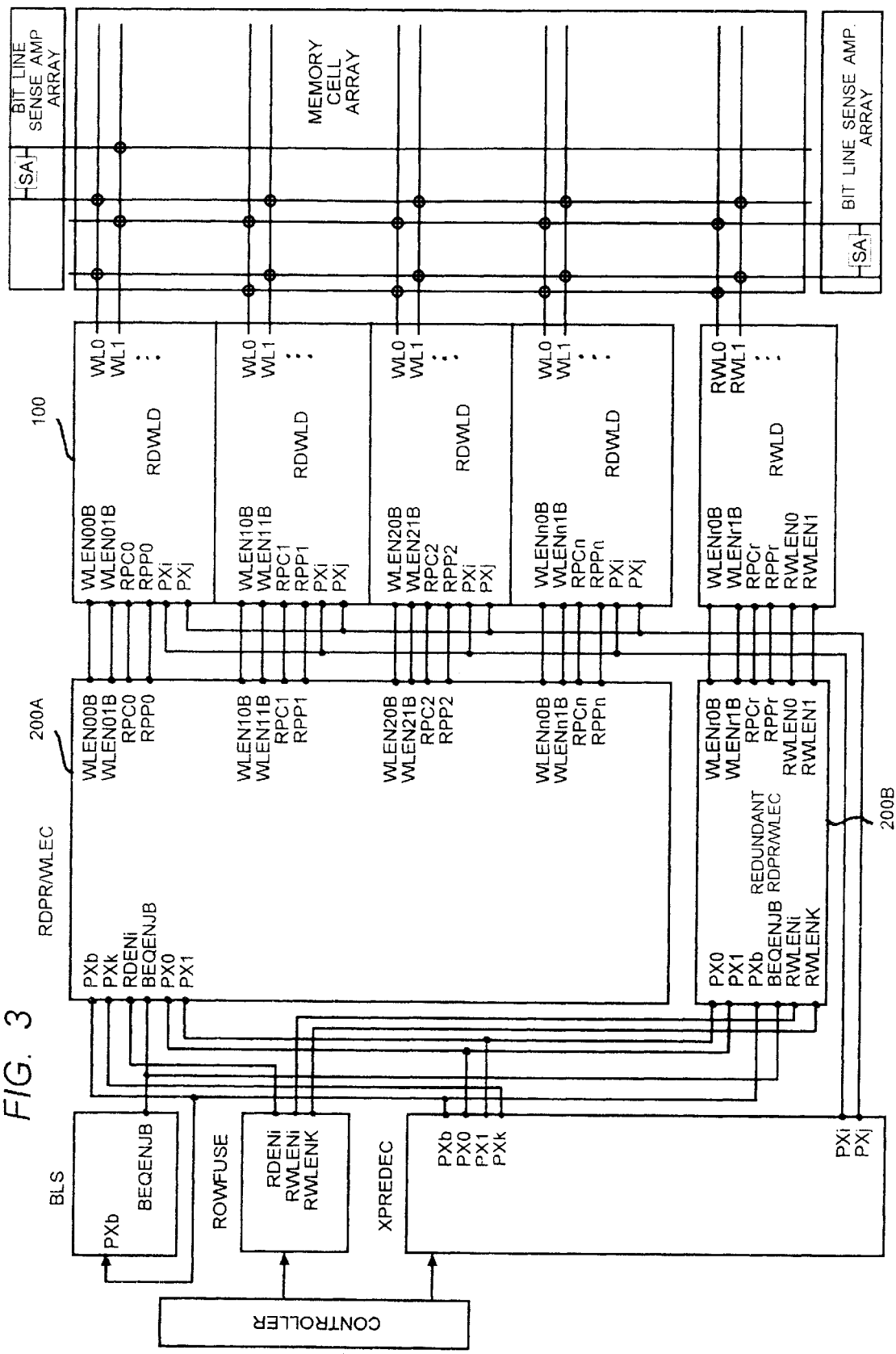
FIG. 3 is a block diagram showing one preferred embodiment of a word line driving circuit and peripheral circuits according to the present invention.

FIG. 3 shows a preferred embodiment of a word line driving circuit for driving a word line coupled to a memory cell array in a semiconductor device according to the present invention and its peripheral circuits. Referring to FIG. 3, a row address predecoder XPREDEC receives addresses from a row address buffer (not shown) and generates signals PXb, PX0, PX1, PXk (k=0,1,2,3, . . . ,n) PXi, PXj. A bit line selecting circuit BLS generates a signal BEQENJB and a row fuse ROWFUSE generates signals RDENi, RWLENI, RWLENK.

A word line selecting circuit 200 respectively inputs the signals BEQENJB, RDENi, PXb, PXk (k=0,1,2,3, . . . ,n), PX0, PX1 from the bit line selecting circuit BLS, the row fuse ROWFUSE and the row address predecoder XPREDEC and outputs signals WLEN00B, WLEN01B, RPC0, RPP0, WLEN10B, WLEN11B, RPC1, RPP1, WLEN20B, WLEN21B, RPC2, RPP2, . . . , WLENn0B, WLENn1B, RPCn, RPPn to "n" row decoder and word line driving (RDWLD) circuits 100. Each of the "n" row decoder and word line driving circuits 100 inputs the signals output from the word line selecting circuit 200 and the signals PXi, PXj output from the row address predecoder XPREDEC and is coupled to a plurality of word lines.

Figure 4:
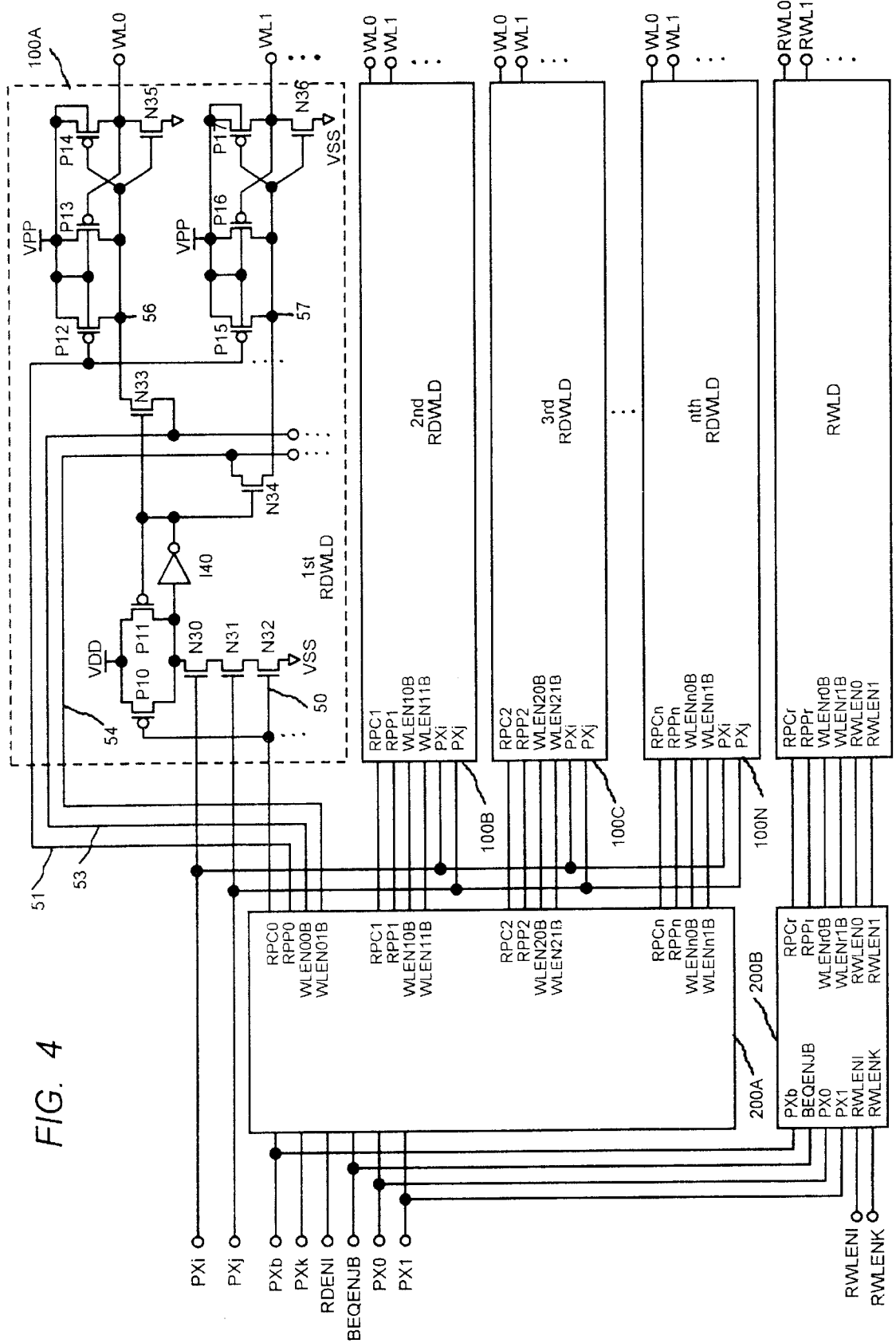
FIG. 4 is a circuit diagram showing the word line driving circuit of FIG. 3.

Operations of the word line driving circuits 100 will now be described. FIG. 4 shows the word line driving circuits 100 according to the preferred embodiment of the present invention. Referring to FIG. 4, a word line selecting circuit 200A respectively inputs the signals BEQENJB, PDENi, PX0, PX1, PXb, PXk (k=0), output from the bit line selecting circuit BLS, the row fuse ROWFUSE and the row address predecoder XPREDEC and generates the precharge signal RPC0 of VCC level, the precharge signal RPP0 of VPP level and the signals WLEN00B and WLEN01B for selecting the word line.

In addition, the word line selecting circuit 200A respectively inputs the signals BEQENJB, RDENi, PX0, PX1, PXb, PXk (k=1), and generates the precharge signal RPC1 of VCC level, the precharge signal RPP1 of VPP level and the signals WLEN10B and WLEN11B for selecting the word line. Further, the word line selecting circuit 200A respectively inputs the signals BEQENJB, RDENi, PX0, PX1, PXb, PXk (k=2), and generates the precharge signal RPC2 of VCC level, the precharge signal RPP2 of VPP level and the signals WLEN20B and WLEN21B for selecting the word line.

The above procedure is repeated until "k" reaches "n". When "k" equals "n", the word line selecting circuit 200A respectively inputs the signals BEQENJB, RDENi, PX0, PX1, PXb, PXk (k=n), and generates the precharge signal RPCn of VCC level, the precharge signal RPPn of VPP level and the signals WLENn0B and WLENn1B for selecting the word line. A redundant word line selecting circuit 200B inputs the signals PXb, PX0, PX1, BEQENJB, RWILENI, RWLENK and generates a precharge signal RPCr of VCC level, a precharge signal RPPr of VPP level, signals WLENr0B and WLENr1B for selecting the word line and redundant word line enable signals RWLEN0 and RWLEN1.

Operations of a first row decoder and word line driving circuit 100A that inputs data output from the word line selecting circuit 200A will now be described. First, the signals RPC0, RPP0, PXi and PXj output from the word line selecting circuit 200A are applied to corresponding transistors P10, N30, N31, N32, and a signal decoded by the signals PXi and PXj is latched by an inverter I40 and a transistor P11.

With the turn-on of a switch transistor N33 applied with the signal WLEN00B, a node 56 is applied with a logic low voltage. Thus, a transistor P14 is turned on and a transistor N35 is turned off. Therefore, a word line WL0 of VPP level is driven for a predetermined time. While not decoding, the transistor N33 is turned off and the signal RPP0 goes to a logic low level. Thus, a transistor P12 is turned on and the node 56 reaches a VPP level, which turns off the transistor P14 and turns on the transistor N35. The word line WL0 goes down to a VSS level and the transistor P13 is turned on to not drive the word line WL0 for a predetermined time.

When selecting another word line, the transistor N34 coupled to the signal WLEN01B is turned on and a node 57 goes to a logic low level, which turns on a transistor P17 and turns off a transistor N36. Thereby, the word line WL1 of VPP level is driven for a predetermined time. While not decoding, the transistor N34 is turned off and the signal RPP0 goes to a logic low level, turning on the transistor P15. Then, the node 57 goes up to the VPP level, which turns off the transistor P17 and turns on the transistor N36. Thereby, the word line goes down to the VSS level and the transistor P16 is turned on to not drive the word line for a predetermined time.

Each of the second to Nth row decoder and word line driving circuits 100B to 100N has the construction of the first row decoder and word line driving circuit 100A and performs similar operations using the signal PXk (k=0,1,2,3, . . . ,n). The redundant word line selecting circuit 200B inputting the signals RWLENI and RWLENK maintains a disable state driving normal operations. In a redundant state, however, any one of the signals PWLEN0 and RWLEN1 is enabled to respectively drive or not drive the redundant word lines RWL0 to RWL1.

As described above, the preferred embodiment of the word line driving circuit has various advantages. The word line driving circuit drives the row decoder and word line driving circuit by dividing the word line selecting circuit with "n" control signals by decoding the signal PXk (k=0, 1,2,3, . . . ,n) to drive one of a plurality of word lines, thus enabling a reduction of power consumption by 1/k and obtaining a high speed operation thereof.

The foregoing embodiments are merely exemplary and are not to be construed as limiting the present invention. The present teaching can be readily applied to other types of apparatuses. The description of the present invention is intended to be illustrative, and not to limit the scope of the claims. Many alternatives, modifications, and variations will be apparent to those skilled in the art.

What is claimed is:

1. A word line driving circuit for a memory device, comprising:

a memory cell array having a plurality of memory cells;

a plurality of word lines coupled to the plurality of memory cells in the memory cell array, wherein the plurality of word lines is divided into a plurality of word line groups;

a controller that generates a memory address signal for driving a selected word line of the plurality of word lines;

a plurality of word line group driving circuits, wherein each of the plurality of word line group driving circuits is coupled to the word lines in a corresponding one of the plurality of word line groups; and a first word line selecting circuit that selects a corresponding word line group driving circuit coupled to a selected word line group of the plurality of word line groups that contains the selected word line to be driven based on the memory address signal.

2. The word line driving circuit of claim 1, wherein each word line of the plurality of word lines belongs to exactly one of the plurality of word line groups.

3. The word line driving circuit of claim 1, wherein the selected word line group driving circuit activates the selected word line in the corresponding word line group.

4. The word line driving circuit of claim 1, wherein the word line selecting circuit outputs a driving signal to the selected word line group.

5. The word line driving circuit of claim 1, wherein the controller drives each of the word lines in the first number of word lines.

6. The word line driving circuit of claim 1, wherein each of the plurality of word line groups contains an equal number of word lines.

7. The word line driving circuit of claim 1, further comprising:

a row fuse;

a row address predecoder that inputs a first signal generated by the controller and generates control signals; and a second word line selecting circuit that inputs the first signal and generates a second signal for selecting a word line of a redundant cell, wherein the second word line selecting circuit receives the signals output from the row address predecoder and the row fuse.

8. The word line driving circuit of claim 1, further comprising:

a row fuse; and a redundant row decoder and word line driving circuit coupled to redundant word lines, wherein the redundant row decoder and word line driving circuit drives the redundant word lines when the row fuse generates information for the selected word line that cannot be used.

9. A word line driving circuit of a semiconductor device for driving a corresponding word line of a plurality of word lines coupled to a plurality of memory cells, wherein the corresponding word line is selected by a memory address signal generated from a controller, the word line driving circuit comprising:

a row address predecoder that inputs a first signal and generates control signals;

a bit line selecting circuit that inputs the first signal and generates a second signal for selecting a bit line corresponding to the first signal;

a plurality of row decoder and word line driving circuits each coupled to one of a plurality of word line groups divided from the plurality of word lines, wherein each of the plurality of row decoder and word line driving circuits input at least one of the control signals generated from the row address predecoder according to a driving control signal; and a word line selecting circuit that receives the second signal and the control signals to select one of the plurality of row decoder and word line driving circuits containing the corresponding word line and applies the driving control signal to a selected row decoder and word line driving circuit.

10. The word line driving circuit of claim 9, further comprising:

a row fuse, and a redundant row decoder and word line driving circuit coupled to redundant word lines, wherein the redundant row decoder and word line driving circuit drives the redundant word lines when the row fuse generates information on the corresponding word line that cannot be used based on the memory address signal.

11. The word line driving circuit of claim 9, wherein the selected row decoder and word line driving circuit activates the corresponding word line in the plurality of word lines.

12. The word line driving circuit of claim 9, wherein each of the plurality of word line groups contains an equal number of word lines.

13. A method for driving a word line of a semiconductor device having a plurality of word lines coupled to a plurality of memory cells having a matrix form of rows and columns, wherein a word line to be driven is selected by a memory address signal generated from a controller, the method comprising:

receiving the memory address signal and generating an internal address signal;

predecoding the internal address signal to generate control signals;

generating a bit line selection signal based on the internal address signal;

dividing the plurality of word lines into a plurality of word line groups;

coupling each of the plurality of word line groups to a row decoder and word line driving circuit, wherein each of the plurality of row decoder and word line driving circuits input at least one of the control signals according to a driving control signal; and selecting one of the plurality of row decoder and word line driving circuits containing a selected word line corresponding to the memory address signal based on the bit line selection signal and the control signals, and applying the driving control signal to the selected row decoder and word line driving circuit.

* * * * *